United States Patent
Lloyd et al.

(10) Patent No.: US 11,515,863 B2
(45) Date of Patent: Nov. 29, 2022

(54) COMB SIGNAL GENERATOR AND METHOD OF PROVIDING A PHASE AND AMPLITUDE REFERENCE

(71) Applicant: Rohde & Schwarz GmbH & Co. KG, Munich (DE)

(72) Inventors: Paul Gareth Lloyd, Munich (DE); Matthias Ruengeler, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/195,223

(22) Filed: Mar. 8, 2021

(65) Prior Publication Data
US 2022/0286119 A1    Sep. 8, 2022

(51) Int. Cl.
| | |
|---|---|
| H03K 3/00 | (2006.01) |
| H03K 5/01 | (2006.01) |
| G01R 35/00 | (2006.01) |
| H03K 3/80 | (2006.01) |
| H03K 3/02 | (2006.01) |

(52) U.S. Cl.
CPC ............. *H03K 5/01* (2013.01); *G01R 35/007* (2013.01); *H03K 3/00* (2013.01); *H03K 3/02* (2013.01); *H03K 3/80* (2013.01)

(58) Field of Classification Search
None
See application file for complete search history.

(56) References Cited

U.S. PATENT DOCUMENTS

| | | | | |
|---|---|---|---|---|
| 4,808,936 A | * | 2/1989 | Lamb | H03B 27/00 327/246 |
| 4,868,428 A | * | 9/1989 | Cooper | H03H 7/20 327/248 |
| 5,065,409 A | * | 11/1991 | Hughes | H04L 27/1525 375/337 |
| 5,265,112 A | * | 11/1993 | Noll | H01S 3/0057 372/32 |
| 5,412,351 A | * | 5/1995 | Nystrom | H03B 27/00 329/305 |
| 8,315,336 B2 | * | 11/2012 | Sorrells | H03F 1/0294 375/297 |
| 10,693,569 B1 | | 6/2020 | Simon et al. | |

(Continued)

FOREIGN PATENT DOCUMENTS

| | | |
|---|---|---|
| CN | 104914393 A | 9/2015 |
| GB | 1529471 | 10/1978 |
| GB | 2478746 A | 9/2011 |

*Primary Examiner* — Tuan T Lam
(74) *Attorney, Agent, or Firm* — Christensen O'Connor Johnson Kindness PLLC

(57) ABSTRACT

A comb signal generator that includes at least two signal sources that each provide a signal, wherein the signals provided by the at least two signal sources are shaped similarly. The com signal generator also has a combining circuit connected with the at least two signal sources, wherein the combining circuit is configured to combine the signals provided by the at least two signal sources, thereby generating a combined signal. Further, the com signal generator includes a clipping circuit connected with the combining circuit, wherein the clipping circuit is configured to receive and process the combined signal, thereby generating a comb signal. Further, a method of providing a phase and amplitude reference is described.

18 Claims, 4 Drawing Sheets

(56) References Cited

U.S. PATENT DOCUMENTS

2012/0063476 A1     3/2012   Anandarajah et al.
2012/0087004 A1     4/2012   Kwon et al.
2016/0209864 A1     7/2016   Roberts \* cited by examiner

COMB SIGNAL GENERATOR AND METHOD OF PROVIDING A PHASE AND AMPLITUDE REFERENCE

FIELD OF THE DISCLOSURE

Embodiments of the present disclosure relate generally to a comb signal generator. Further, embodiments of the present disclosure provide a method of providing a phase and amplitude reference for a device to be calibrated.

BACKGROUND

Modern electronic devices inter alia comprise receivers that may have frequency-converting units such as a mixer. For setting up the electronic device, e.g. the (integrated) receiver, a phase calibration and/or amplitude, calibration is necessary, in particular for frequency-converting measurements.

So far, a harmonic grid of several frequency points is generated that is used for the respective calibration of the receiver, in particular the frequency-converting unit, also called frequency-converting device under test in the specific calibration procedure. For doing so, a base frequency is defined that is processed by division and pulse shaping in order to obtain a comb spectrum. The comb spectrum comprises several comb lines wherein all comb lines, namely equally spaced frequency lines, have a certain relationship to the base frequency defined previously. However, the receiver can only be calibrated with regard to its phase relationship for frequencies that correspond to the comb lines. In other words, these solutions do not provide a fine frequency resolution.

Other solutions known in the state of the art have certain uncertainties, resulting in a less precise phase and amplitude reference that can be used for calibration purposes. Further known solutions do not provide the required characteristics for high signal levels at higher frequencies.

Accordingly, there is a need for a possibility to calibrate a respective device under test in a more accurate and fast manner SUMMARY Embodiments of the present disclosure relate to a comb signal generator. In an embodiment, the comb signal generator comprises at least two signal sources that each provide a signal, wherein the signals provided by the at least two signal sources are shaped similarly. Further, the comb signal generator has a combining circuit connected with the at least two signal sources, wherein the combining circuit is configured to combine the signals provided by the at least two signal sources, thereby generating a combined signal. In addition, the comb signal generator comprises a clipping circuit connected with a combining circuit, wherein the clipping circuit is configured to receive and process the combined signal, thereby generating a comb signal.

Further, embodiments of the present disclosure relate to a method of providing a phase and amplitude reference for a device to be calibrated. In an embodiment, the method comprises the steps of:

generating, by using a first signal source, a first signal with a first frequency;

generating, by using a second signal source, a second signal with a second frequency;

feeding the first signal and the second signal into a combining circuit;

combining the first signal and the second signal passively, thereby generating a combined signal; and feeding a clipping circuit with the combined signal, which processes the combined signal, thereby generating a comb signal.

Accordingly, embodiments of the comb signal generator generate a comb signal having a spectrum of frequencies whose relative amplitudes and phases are well defined, enabling a precise calibration of devices to be calibrated, e.g., phase sensitive receivers. Therefore, the comb signal generators of the disclosure generate a comb signal that comprises several discrete frequencies, wherein the comb signal generated has amplitude and phase components that are precisely defined due to the processing of the signals provided by the at least two signal sources in order to generate the comb signal. In some embodiments, the at least two signal sources may relate to two discrete signal generators that output respective signals which are processed by the internal components of the comb signal generator appropriately in order to generate the comb signal with the respective comb spectrum, namely the different spectral lines.

Generally, the clipping circuit is designed to prevent the combined signal generated by the combining circuit from exceeding a predetermined level. However, the clipping circuit does not affect or rather distort the remaining part of the combined signal, namely the applied waveform. Thus, the clipping circuit is enabled to select a part of the combined signal that is located above or below the predetermined level.

In some embodiments, the clipping circuit may also apply two predetermined levels such that a middle portion of the combined signal is obtained that is used for further processing.

In summary, clipping provided by the clipping circuit may be achieved either at one level or two levels. The clipper circuit may remove certain portions of an arbitrary waveform, namely the combined signal forwarded to the clipping circuit. In some embodiments, the portions of the combined signal are removed that are near the positive or negative peaks or both. Thus, clipping changes the shape of the waveform and alters its spectral components.

The comb signal generated can be used as a phase and amplitude reference for a device to be calibrated. Alternatively, a phase and amplitude reference for a device to be calibrated can be derived from the comb signal generated.

Generally, the frequencies of the spectral lines provided ensure that the respective frequencies may be chosen in a desired manner, as this depends on the frequencies of the signals provided by the signal sources. Therefore, the calibration of the device to be calibrated can be done in any arbitrary manner since the frequency points used for calibrating the device to be calibrated do not necessarily have to correspond to frequency points of a harmonic frequency grid.

Put another way, by choosing the frequencies of the first signal source and the second signal source in an appropriate way, a typical measurement setup for a frequency-converting device under test, like a mixer, can be phase-calibrated at exactly the frequencies that are of interest. These need not necessarily coincide with a harmonic frequency grid.

An aspect provides that the comb signal generator comprises an output that is configured to output an output signal. Thus, the comb signal generator may be established in an integral manner which means that the at least two signal sources, the combining circuit, as well as the clipping circuit are encompassed in a common housing. The output of the comb signal generator is associated with an outer surface of the housing. Thus, the output can be accessed easily, for instance for connecting with the device to be calibrated.

In some embodiments, the output signal corresponds to the comb signal generated by the clipping circuit. Therefore, the clipping circuit is directly connected with the output of the comb signal generator such that the comb signal generated by the clipping circuit is directly forwarded to the output for being outputted appropriately.

Alternatively, the output signal is derived from the comb signal generated by the clipping circuit. Hence, the clipping circuit is indirectly connected with the output such that at least one further processing circuit may be located between the clipping circuit and the output. This processing circuit processes the comb signal generated by the clipping circuit such that a modified signal is generated that is forwarded to the output for being outputted. The modified signal, however, also corresponds to a comb signal.

Hence, the comb signal generator always outputs a comb signal. However, the comb signal outputted, namely the output signal, may be different to the comb signal that was originally obtained by the clipping circuit, as the comb signal of the clipping circuit is further processed by at least one further processing circuit.

Another aspect provides that the signals provided by the at least two signal sources are sinusoidal signals. The signal sources may output ideally pure sinusoidal signals. As mentioned above, the signals provided by the at least signal sources are shaped similarly such that both signals relate to sinusoidal signals, e.g., ideally pure sinusoidal signals.

However, the signals provided by the at least to signal sources are associated with different frequencies. Hence, the sinusoidal signals have different frequencies. The spacing between the different frequencies provides the resolution of the comb signal having the several discrete frequencies, namely the distance in frequency between the several spectral lines of the output signal.

The combined signal generated by the combining circuit may be a two-tone signal. The signals provided by the at least two signal sources are combined by the combining circuit such that their individual tones, namely the respective single-tone signals, are combined with each other, thereby obtaining the two-tone signal.

The combining circuit may be configured to combine the signals provided by the at least two signal sources linearly. Therefore, the two-tone signal is generated as the signals provided by the at least two signal sources are linearly combined.

For instance, the at least two sinusoidal signals provided by the signal sources are summed, wherein the resultant two-tone signal is forwarded to the clipping circuit for further processing. The respective amplitudes of the two tones are so high that the clipping circuit is forced to clip as much as possible of the respective signal components, thereby shaping the combined signal during its processing by the clipping circuit.

In other words, the amplitudes of the tones of the two-tone signal exceed the at least one predetermined level of the clipping circuit such that the clipping circuit becomes active, thereby clipping a certain portion of the combined signal.

Generally, the respective shaping performed by the clipping circuit may modify the combined signal to a square-wave, for example modify a signal envelope of the combined signal, namely the two-tone signal, from half-sinusoidal to a rectangular wave or rather pulse train in an ideally totally non-linear operation. The spectrum of the signal generated by the clipping circuit relates to a two-tone multiple-order distortion that comprises an infinite number of tones or rather spectral lines, resulting in the comb signal.

In some embodiments, the individual amplitudes and phases of the spectral lines are well defined. Therefore, it is not necessary that the device to be calibrated, e.g. the receiver, has to know anything about the signal sources. In other words, it is not necessary that calibration tables have to be exchanged previously with the device to be calibrated.

In some embodiments, the tones of the two-tone signal have a fixed and constant phase difference, wherein the phase difference between the adjacent tones in the comb signal is equal to the phase difference between the signals provided by the at least two signal sources, namely the input signals or rather the input tones. The amplitudes follow the standard Fourier transform of a square wave.

Another aspect provides that the combining circuit is a passive combining circuit and/or that the combining circuit comprises at least one of a passive adder and a passive combiner. Therefore, the signals provided by the at least two signal sources are combined with each other in a passive manner, thereby establishing the combined signal that is further processed by the clipping circuit in order to generate the comb signal by modifying/shaping the combined signal appropriately.

The comb signal generator may comprise more than two signal sources that are connected with the combining circuit. In other words, three or more tones may be used. Therefore, a multiple tone signal with more than two tones may be generated by the comb signal generator, for example the combining circuit. The respective multiple tone signal obtained by the combining circuit is forwarded to the clipping circuit that processes the multiple tone signal in order to shape/modify the respective waveform of the combined signal.

However, an embodiment with more than two signal sources is critical or rather complicated with regard to the relative phase of the tones. In contrast, the relative phase of the tones is not an issue for an embodiment that comprises exactly two signal sources that provide two tones.

Another embodiment provides that the at least two signal sources, the combining circuit and the clipping circuit together establish a module. The respective module may relate to a hardware module. The module may be extendable such that two or more modules may be connected with each other, thereby increasing the overall functionality of the comb signal generator.

For instance, the comb signal generator comprises at least two modules that are connected with each other via a combiner that is connected with respective clipping circuits of the modules. The combiner connects the at least two modules such that the combiner is configured to receive the respective comb signals generated by the clipping circuits of the modules. The combiner, e.g. the passive combiner, combines the respective comb signals generated in order to obtain a further combined signal that is forwarded.

Since two comb signals are received and combined with each other by the combiner, the further combined signal also relates to a comb signal.

According to another embodiment, the comb signal generator comprises a third signal source that provides a third signal. The third signal source and the clipping circuit both are connected to a combiner that is configured to combine the third signal and the combined signal generated by the clipping circuit, thereby generating a further combined signal. Thus, the comb signal generated is combined further with the third signal that is provided by the third signal source. Hence, a cascade-like comb signal generator is provided.

In some embodiments, the comb signal generator comprises a clipper, such as clipper circuitry, that is connected with the combiner, wherein the clipper is configured to receive and process the further combined signal, thereby generating a further comb signal. Therefore, it is ensured that a comb signal is generated, namely the further comb signal, that is based on the comb signal generated by the clipping circuit and the third signal provided by the third signal source. The further comb signal may be forwarded to the output of the comb signal generator such that the output signal corresponds to the further comb signal.

According to another aspect, the at least two signal sources are independent of each other. Further, the at least two signal sources may relate to free-running oscillators, namely oscillators without active control. In some embodiments, the respective method of signal generating of the signal provided by the respective signal source is not important for the comb signal generator. For instance, the signal generation may be done by a direct digital synthesizer (DDS) or rather free-running oscillators.

For instance, at least one of the at least two signal sources is a frequency-locked or a phase-locked signal source. Therefore, the phase and/or frequency relationships can be set appropriately, for example the ones of the spectral lines of the comb signal.

Moreover, at least one of the at least two signal sources is derived from a common reference source. In some embodiments, both signal sources are derived from a common reference source. This ensures a specific relative phase relationship between the signals provided by the at least two signal sources.

A single diode, a network of diodes or a linearized circuit may establish the clipping circuit. The clipping circuit may consist of linear components like resistors and non-linear components like diodes or transistors. However, embodiments of the clipping circuit do not contain energy-storage components like capacitors. For instance, the clipping circuit, also called a hard limiter, may be established by a pair of anti-parallel diodes. This clipping circuit is also called two shunt diode clipping circuit.

The clipping circuit may be established by a circuit that provides a constant gain or rather constant output power characteristic.

Furthermore, the signal sources may be associated with a buffer amplifier that provides electrical impedance transformation.

Generally, the comb signal generator is based on the idea that the comb signal generator comprises a passive combining circuit that is connected with the signal sources such that the signals provided by the signal sources are passively combined with each other by the combining circuit, thereby generating the combined signal. The combined signal that corresponds to a multi-tone signal, e.g. a two-tone signal, is forwarded to the clipping circuit, namely the limiter circuit, which clips/limits the respective waveform of the combined signal. Put differently, a portion of the combined signal is clipped/cut, thereby generating the comb signal that has the several discrete frequencies whose amplitude and phase components are precisely defined. In other words, the comb signal has a spectrum that comprises an infinite number of spectral lines, also called tones. In the special case of clipping, the individual amplitudes and phases of this infinite number of spectral lines are well defined.

In some embodiments described herein, the term "module" refers to or includes, inter alia, a combination of hardware (e.g. a processor such as an integrated circuit or other circuitry) and software (e.g. machine- or processor-executable instructions, commands, or code such as firmware, programming, or object code). Furthermore, a combination of hardware and software may include hardware only (i.e. a hardware element with no software elements), software hosted at hardware (e.g. software that is stored at a memory and executed or interpreted at a processor), or hardware with the software hosted thereon. In some embodiments, the hardware may, inter alia, comprise a CPU, a GPU, an FPGA, an ASIC, or other types of electronic circuitry.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
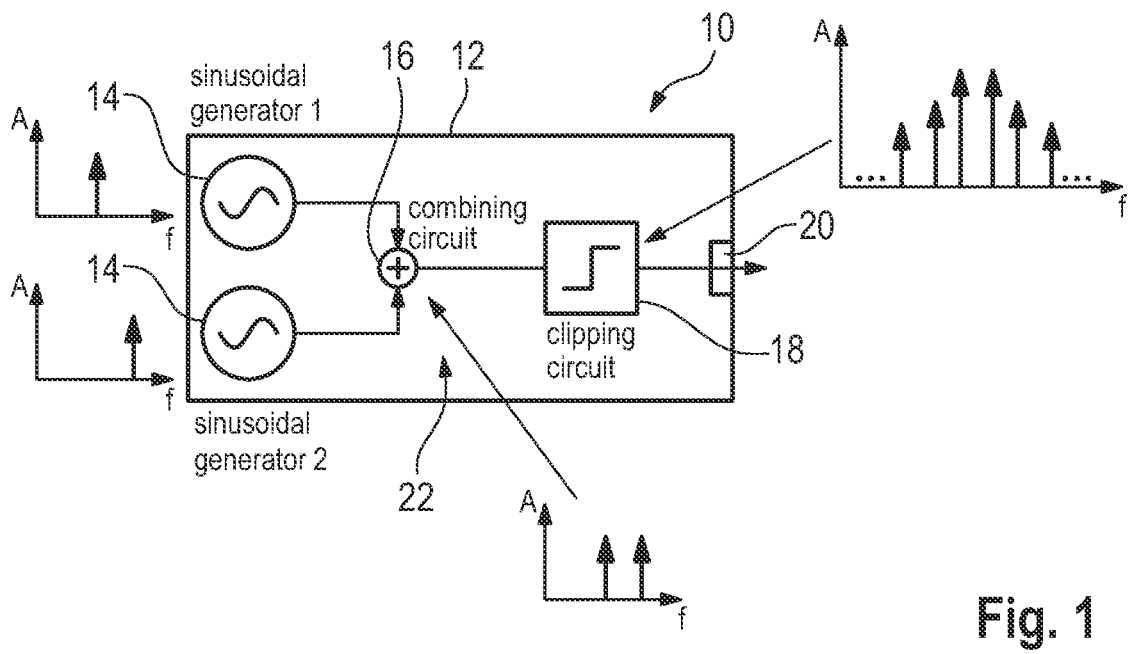
FIG. 1 schematically shows an overview of a comb signal generator according to a first embodiment of the present disclosure.

FIG. 1 shows a comb signal generator 10 that comprises a housing 12 in which components of the comb signal generator 10 are encompassed. In the shown embodiment, the comb signal generator 10 comprises two signal sources 14 that each provide a signal, wherein the signals provided by the signal sources 14 are shaped similarly.

In some embodiments, both signal sources 14 output or rather provide a sinusoidal signal wherein the sinusoidal signals provided by the signal sources 14 have different frequencies as illustrated by the respective diagrams associated with the signal sources 14.

The signal sources 14 are connected with a combining circuit 16 that may also be called a summing junction, as the combining circuit 16 receives the signals provided by the signal sources 14, namely the sinusoidal signals having different frequencies. The combining circuit 16 is configured to combine the signals received from the signal sources 14, thereby generating a combined signal that relates to a two-tone signal as illustrated by the respective diagram associated with the combining circuit 16.

Generally, the combining circuit 16 or rather the summing junction may be established, for example, by a power splitter, a power combiner, etc. However, there are many ways to realize the combining circuit 16 or rather the summing junction. The respective selection depends on the frequency range of use as well as the sensitivity of the signal sources 14 to frequency/load-pulling. For instance, a resistive combiner may be used or even a Wilkinson combiner. In some embodiments, the resistive combiner has a wide bandwidth, but no isolation, whereas the Wilkinson combiner has excellent isolation, but a lower bandwidth compared to the resistive combiner.

Figure 5:
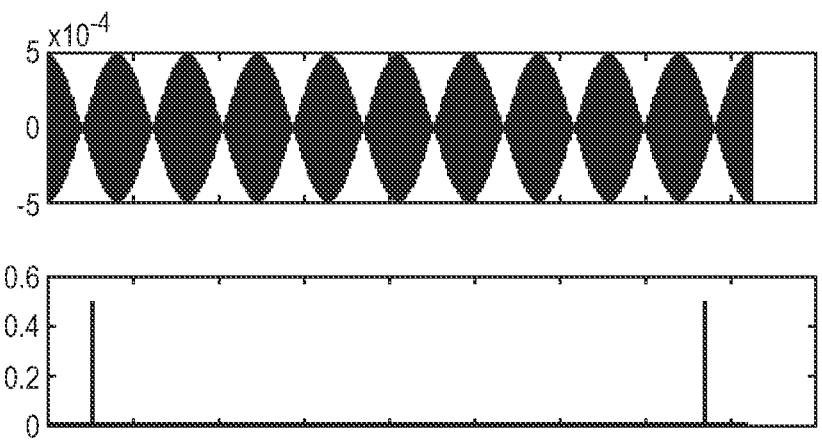
FIG. 5 shows an overview illustrating the combined signal.

In some embodiments, the combining circuit 16 is configured to combine the signals provided by the signal sources 14 linearly, thereby generating the two-tone signal. A more detailed overview regarding the combined signal, namely the two-tone signal, is shown in FIG. 5. In FIG. 5, the combined signal is shown in time domain and in frequency domain.

In some embodiments, the combining circuit 16 is a passive combining circuit, as it comprises a passive adder and/or a passive combiner, thereby establishing the summing junction that sums the individual sinusoidal signals provided the signal sources 14 in order to generate the combined signal.

Figure 6:
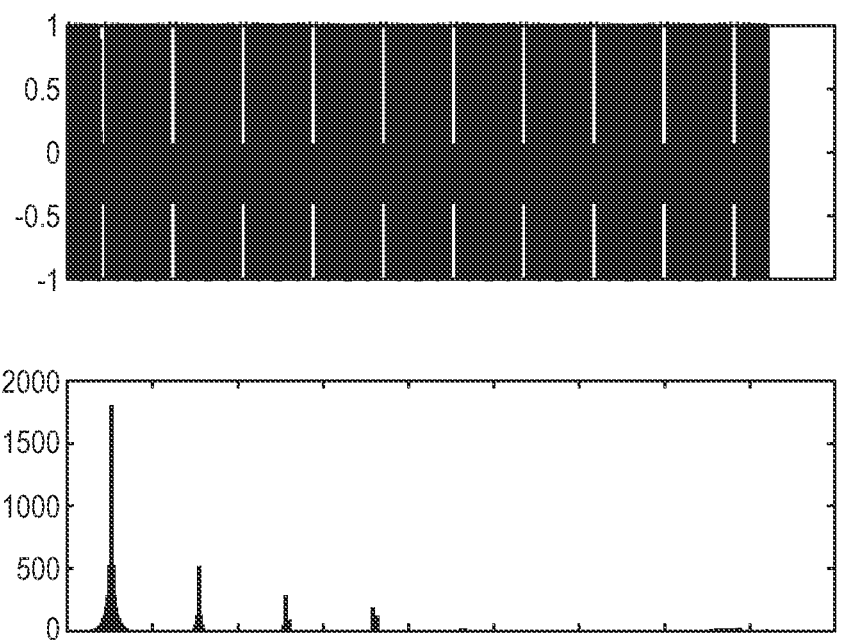
FIG. 6 shows an overview illustrating the comb signal.

The comb signal generator 10 also comprises a clipping circuit 18 that is connected with the combining circuit 16 such that the clipping circuit 18 receives the combined signal from the combining circuit 16. The clipping circuit 18 is configured to process the combined signal, thereby generating a comb signal that has several discrete frequency lines or rather spectral lines as illustrated in the respective diagram that is associated with the clipping circuit 18. A more detailed overview regarding the comb signal, e.g., its spectral lines, is shown in FIG. 6. In FIG. 6, the comb signal is shown in time domain and in frequency domain.

Figure 7:
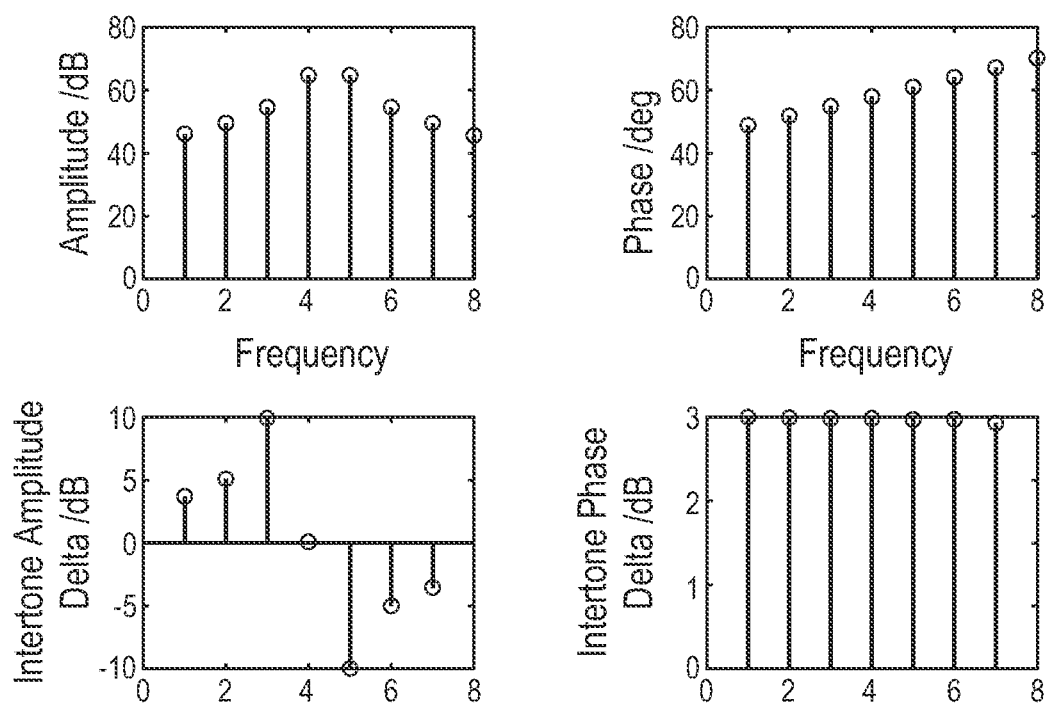
FIG. 7 shows an overview illustrating information concerning the spectral lines of the comb signal.

Further information regarding the spectral lines is provided by the overview shown in FIG. 7, wherein information regarding the amplitude and the phase of the spectral lines is illustrated.

In the shown embodiment, the clipping circuit 18 is directly connected with an output 20 of the comb signal generator 10 that is located in an outer surface of the housing 12. Via the output 20, an output signal is outputted, wherein the output signal corresponds to the comb signal generated by the clipping circuit 18 in the shown embodiment.

In some embodiments, the signal sources 14, the combining circuit 16 as well as the clipping circuit 18 together establish a module 22, which may be provided in an integrative and modular manner Therefore, the comb signal generator 10 may be extended by encompassing more than one module 22.

Figure 2:
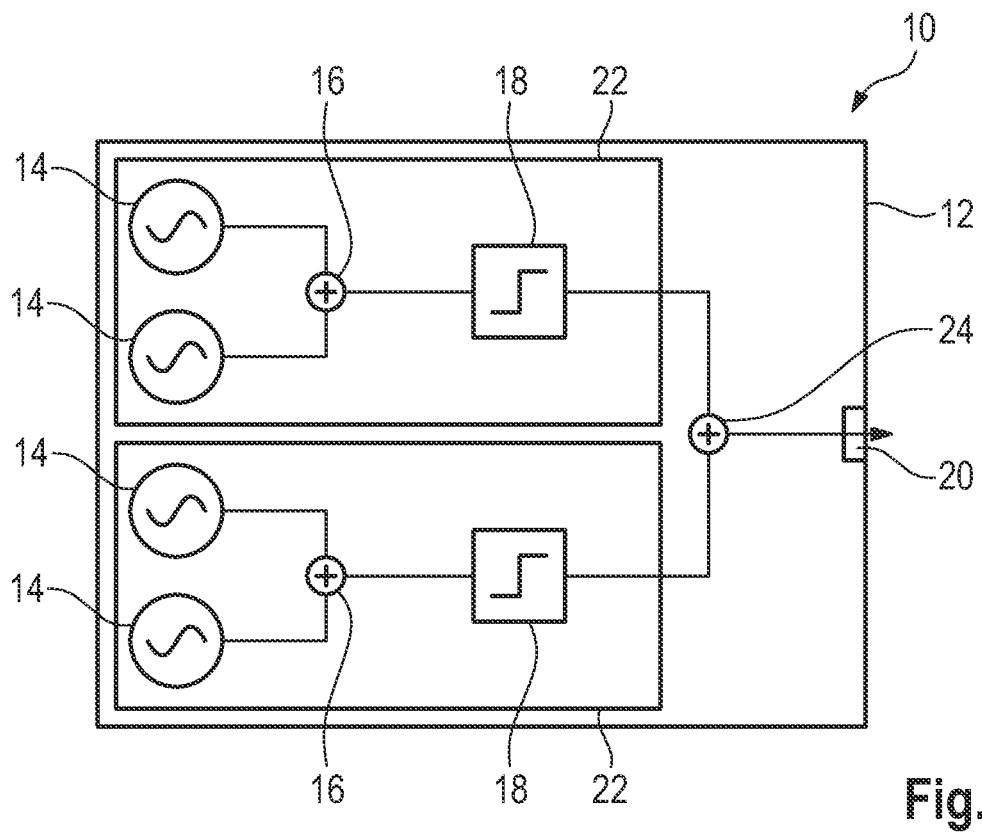
FIG. 2 schematically shows an overview of a comb signal generator according to a second embodiment of the present disclosure.

A representative embodiment is shown in FIG. 2, as the comb signal generator 10 comprises two modules 22 that are connected with each other via a combiner 24. The combiner 24 is directly connected with the respective clipping circuit 18 of the modules 22 such that the comb signal provided by the respective clipping circuit 18 are combined by the combiner 24 appropriately thereby generating a further combined signal that corresponds to the output signal of the comb signal generator 10, as the combiner 24 is directly connected with the output 20 of the comb signal generator 10.

The embodiment shown in FIG. 2 is also called corporate variant, as it comprises two modules 22, each having two signal sources 14, one combining circuit 16 and one clipping circuit 18, wherein the modules 22 are connected with each other by the combiner 24, for example a passive combiner such as a passive adder.

Figure 3:
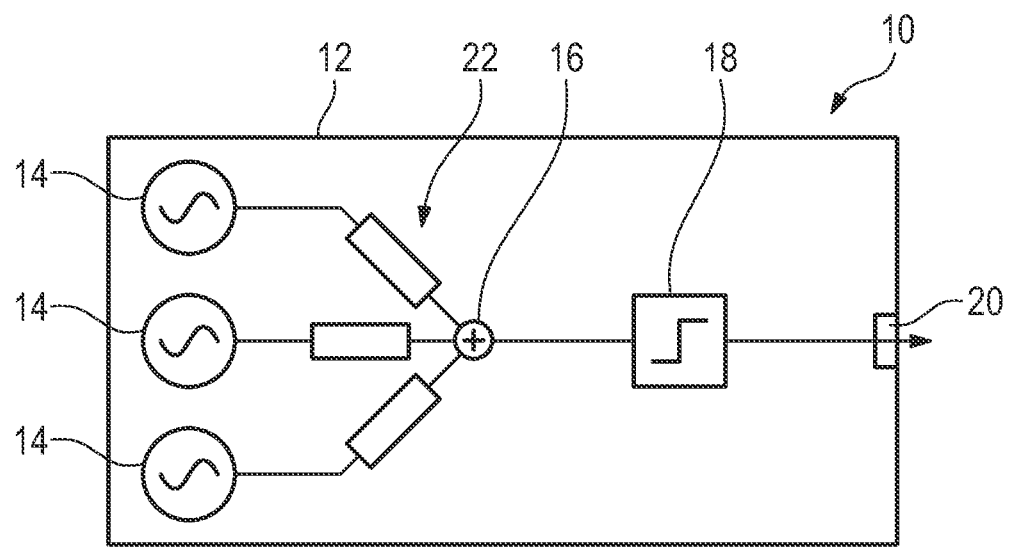
FIG. 3 schematically shows an overview of a comb signal generator according to a third embodiment of the present disclosure.

In FIG. 3, another embodiment of the comb signal generator 10 is shown that substantially corresponds to the one shown in FIG. 1.

In some embodiments, the comb signal generator 10 comprises three signal sources 14 that are connected with the combining circuit 16 such that the combining circuit 16 processes three different signals, namely three sinusoidal signals having different frequencies, in order to generate a three-tone signal that corresponds to the combined signal. The three-tone signal is forwarded to the clipping circuit 18 for being processed by the clipping circuit 18 appropriately.

In some embodiments, the three signal sources 14, the combining circuit 16 as well as the clipping circuit 18 together may establish the module 22.

Figure 4:
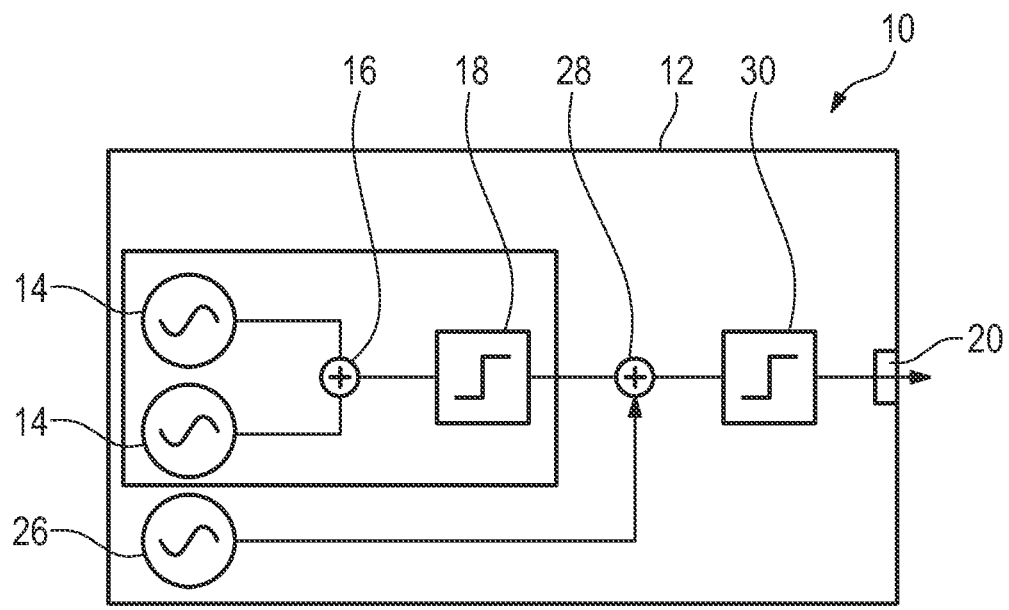
FIG. 4 schematically shows an overview of a comb signal generator according to a fourth embodiment of the present disclosure.

In some embodiments, the comb signal generator 10 shown in FIG. 3 is also called N-way variant, as it comprises n=3 signal sources 14 that provide n=3 signals. In FIG. 4, a further embodiment of the comb signal generator 10 is shown that is based on the embodiment shown in FIG. 1. In some embodiments, the embodiment shown in FIG. 4 also comprises the module 22, wherein the comb signal generator 10 additionally comprises a third signal source 26 that provides a third signal.

In contrast to the embodiment shown in FIG. 3, the third signal source 26 is connected with a combiner 28 that is also connected with the clipping circuit 18 of the module 22.

Thus, both the clipping circuit 18 and the third signal source 26 are connected with the combiner 28 that is configured to combine the third signal provided by the third signal source 26 and the comb signal generated by the clipping circuit 18. The combiner 28 generates a further combined signal based on the comb signal and the third signal received.

The comb signal generator 10 according to the fourth embodiment further comprises a clipper 30, such as clipper circuitry, that is connected with the combiner 28 such that the clipper 30 receives and processes the further combined signal generated by the clipper 30. The clipper 30 processes the further combined signal, thereby generating a further comb signal that has the respective characteristics of a comb signal, namely the several spectral lines.

In any case, it is ensured that the comb signal generator 10 outputs an output signal that substantially corresponds to a comb signal having several discrete frequencies with a well-known amplitude and phase relationship.

Therefore, the respective output signal outputted by the comb signal generator 10 can be used for accurate and precise calibration of a device to be calibrated, e.g. a receiver.

Moreover, the embodiments shown are based on a passive combination of the signals provided by the signal sources 14. Therefore, the combining circuit 16 relates to a passive combining circuit that passively combines the signals received, e.g., without any active control.

The combined signal generated by the combining circuit 16 undergoes the clipping while being processed by the clipping circuit 18 such that a comb signal is obtained that is used for calibrating the device to be calibrated.

In a certain embodiment, a 5G measurement device that typically operates over several 100 MHz at 40 GHz shall be calibrated. According to the prior art, a comb generator with a 10 MHz reference may be used that has to generate the $4.000^{th}$ harmonic with an extremely low signal-to-noise ratio (SNR) that is not usable anymore. Alternatively, it was known in the state of the art to use a 4 GHz reference, for instance. Thus, the $10^{th}$ harmonic would already be sufficient for calibrating the 5G measurement device. However, the frequency grid, also called raster, is significantly larger, namely step size of 4 GHz, compared to the previous prior art solution. In some embodiments, the frequency grid or rather the step size is larger than the frequency band of interest. Hence, interpolation calculations are required which are time-consuming and which require respective computational resources.

In contrast to the prior art, the comb signal generator 10 according to embodiments of the present disclosure may make use of the two signal sources 14 that provide tones of 39.995 GHz and 40.005 GHz, respectively. Thus, a 10 MHz spacing around 40 GHz can be obtained.

Thus, the signal-to-noise ratio (SNR) is improved compared to the first known solution in the prior art mentioned above, while simultaneously providing a small frequency grid compared to the second known solution in the prior art mentioned above.

Hence, the signal levels at the output 20, for example the signal levels of the comb signal generated by the clipping circuit 18, are at their highest level in that frequency range, e.g., several 10s of dBs higher than the ones provided by the comb generator mentioned above. Further, the amplitudes of those tones have a precise level (as well as phase), enabling to perform a real vector calibration.

Moreover, a narrower frequency grid as well as a more accurate reference signal, e.g. the output signal, can be created by the comb signal generator 10, for example for any given frequency of interest.

In summary, the comb signal generator 10 provides a precise phase and amplitude reference with high signal levels at high frequencies, thereby ensuring a faster and more accurate calibration. Additionally, a fine frequency grid or rather frequency resolution is obtained such that post-processing and interpolation techniques can be reduced or rather minimized, for example avoided completely.

Certain embodiments disclosed herein, for example the respective module(s), utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about", "approximately", "near" etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A comb signal generator, comprising:
    at least two signal sources that each provide a signal, wherein the signals provided by the at least two signal sources are shaped similarly;
    a combining circuit connected with the at least two signal sources, wherein the combining circuit is configured to combine the signals provided by the at least two signal sources, thereby generating a combined signal; and
    a clipping circuit connected with the combining circuit, wherein the clipping circuit is configured to receive and process the combined signal, thereby removing certain portions of the combined signal forwarded to the clipping circuit and generating a comb signal that has several discrete frequency lines.

2. The comb signal generator according to claim 1, further comprising an output that is configured to output an output signal.

3. The comb signal generator according to claim 2, wherein the output signal corresponds to the comb signal generated by the clipping circuit or wherein the output signal is derived from the comb signal generated by the clipping circuit.

4. The comb signal generator according to claim 1, wherein the signals provided by the at least two signal sources are sinusoidal signals.

5. The comb signal generator according to claim 1, wherein the combined signal generated by the combining circuit is a two-tone signal.

6. The comb signal generator according to claim 1, wherein the combining circuit is configured to combine the signals provided by the at least two signal sources linearly.

7. The comb signal generator according to claim 1, wherein the combining circuit is a passive combining circuit and/or wherein the combining circuit comprises at least one of a passive adder and a passive combiner.

8. The comb signal generator according to claim 1, wherein the comb signal generator comprises more than two signal sources that are connected with the combining circuit.

9. The comb signal generator according to claim 1, wherein the at least two signal sources, the combining circuit and the clipping circuit together establish a module.

10. The comb signal generator according to claim 9, wherein the comb signal generator comprises at least two modules that are connected with each other via a combiner that is connected with the respective clipping circuits of the modules.

11. The comb signal generator according to claim 1, wherein the comb signal generator comprises a third signal source that provides a third signal, wherein the third signal source and the clipping circuit both are connected to a combiner that is configured to combine the third signal and the comb signal generated by the clipping circuit, thereby generating a further combined signal.

12. The comb signal generator according to claim 11, wherein the comb signal generator comprises a clipper that is connected with the combiner, and wherein the clipper is configured to receive and process the further combined signal, thereby generating a further comb signal.

13. The comb signal generator according to claim 1, wherein the at least two signal sources are independent of each other and/or free-running oscillators.

14. The comb signal generator according to claim 1, wherein at least one of the at least two signal sources is a frequency-locked or phase-locked signal source.

15. The comb signal generator according to claim 1, wherein at least one of the at least two signal sources is derived from a common reference source.

16. The comb signal generator according to claim 1, wherein the clipping circuit is established by a single diode, a network of diodes or a linearized circuit.

17. A method of providing a phase and amplitude reference for a device to be calibrated, the method comprising:
generating, by using a first signal source, a first signal with a first frequency;
generating, by using a second signal source, a second signal with a second frequency that is different from the first frequency;
feeding the first signal and the second signal into a combining circuit;
combining the first signal and the second signal passively, thereby generating a combined signal that is a two-tone signal; and
feeding a clipping circuit with the two-tone signal, which processes the two-tone signal, wherein the respective amplitudes of the two tones are such that the clipping circuit is forced to clip as much as possible of respective signal components, thereby shaping the combined signal during signal processing by the clipping circuit while removing certain portions of the combined signal forwarded to the clipping circuit and generating a comb signal.

18. A comb signal generator, comprising:
at least two signal sources that each provide a signal, wherein the signals provided by the at least two signal sources are shaped similarly, wherein the signals provided by the at least two signal sources are sinusoidal signals that have different frequencies;
a combining circuit connected with the at least two signal sources, wherein the combining circuit is configured to combine the signals provided by the at least two signal sources, thereby generating a combined multiple tone signal; and
a clipping circuit connected with the combining circuit, wherein the clipping circuit is configured to receive and process the combined multiple tone signal, wherein the clipping circuit is configured to shape the respective waveform of the combined multiple tone signal while altering the spectral components of the combined multiple tone signal, thereby generating a comb signal.

* * * * *